United States Patent [19]
Wark

[11] Patent Number: 6,004,142
[45] Date of Patent: *Dec. 21, 1999

[54] INTERPOSER CONVERTER TO ALLOW SINGLE-SIDED CONTACT TO CIRCUIT MODULES

[75] Inventor: James M. Wark, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/810,048

[22] Filed: Mar. 4, 1997

[51] Int. Cl.⁶ .................................................. H01R 9/09
[52] U.S. Cl. ............................ 439/74; 439/326; 439/637
[58] Field of Search ............................. 439/74, 75, 331, 439/326, 131, 637; 324/755, 757, 758

[56] References Cited

U.S. PATENT DOCUMENTS

| | | | |
|---|---|---|---|
| 3,701,071 | 10/1972 | Landman | 439/326 |
| 3,746,932 | 7/1973 | Hogan et al. | 439/637 |
| 4,718,859 | 1/1988 | Gardner | 439/635 |
| 5,256,078 | 10/1993 | Lwee et al. | 439/326 |
| 5,334,030 | 8/1994 | Brilliott | 439/75 |
| 5,337,220 | 8/1994 | Granitz | 439/326 |
| 5,511,985 | 4/1996 | Noschese et al. | 439/157 |
| 5,514,002 | 5/1996 | Cheng et al. | 439/637 |
| 5,525,812 | 6/1996 | Bandzuch et al. | 257/48 |
| 5,657,081 | 8/1997 | Kurahashi | 439/331 |
| 5,690,502 | 11/1997 | Mochizuki | 439/326 |
| 5,695,354 | 12/1997 | Noda | 439/326 |
| 5,697,802 | 12/1997 | Kawabe | 439/326 |
| 5,779,494 | 7/1998 | Ito et al. | 439/328 |

FOREIGN PATENT DOCUMENTS

| | | | |
|---|---|---|---|
| 60-173790 | 7/1985 | Japan | 439/326 |

*Primary Examiner*—Paula Bradley
*Assistant Examiner*—Tho D. Ta
*Attorney, Agent, or Firm*—Trask, Britt & Rossa

[57] ABSTRACT

An apparatus and method for routing all external connection points of a double-sided edge connector of a circuit card to one side of a test tray suitable for testing with a bed of nails, "pogo pin" or similar type of load board for functional testing of said circuit card. A first embodiment of the apparatus includes a pivotally mounted or snap-in removable electrical and mechanical receptacle with a slot or socket suitable for holding a double-sided edge connector of a circuit card in a test tray. The receptacle pivots or is otherwise mounted in the test tray to allow the circuit card to lie co-planar with the test tray, thus providing perpendicular contact to the pins of a bed of nails load board. Another embodiment provides a fixed receptacle mounted vertically that routes all edge connector traces to the bottom surface of the test tray, again, suitable for engaging with a bed of nails-type test board.

11 Claims, 4 Drawing Sheets

INTERPOSER CONVERTER TO ALLOW SINGLE-SIDED CONTACT TO CIRCUIT MODULES

BACKGROUND OF THE INVENTION

1. Field of the Invention

The present invention relates to an interface adapter for providing single-sided electrical contact to a circuit card bearing contact elements on two sides.

2. State of the Art

Modern personal computers are designed to be easily upgraded by swapping out old components and replacing them with newer, faster, and higher capacity parts. For example, computer memory such as dynamic random access memory (DRAM) is upgraded by inserting single in-line memory modules (SIMMs) into preexisting sockets on a motherboard. SIMMs are small circuit cards with memory chips attached and a single-sided edge connector having a data width of 32-bits. Dual in-line memory modules (DIMMs) provide greater data widths (64- and 72-bits) and higher memory density, particularly useful for size-limited applications such as notebook computers. Microprocessors are also trending toward greater data (word) widths. DIMMs have double-sided edge connectors to maintain a small form factor with wider data widths. The trend in state-of-the-art microprocessors is also toward wider word widths. This trend is generating demand for higher performance memory components such as DIMMs.

SIMMs and DIMMS are tested for burn-in (infant mortality) and functionality. For purposes of burn-in testing, standard SIMM and DIMM sockets can be used to test for infant mortality. Functional testing is performed on automatic test equipment, typically with a "bed of nails" type interface which was originally designed to simultaneously test a plurality of individual packaged dice. However, in the case of a SIMM cards, with its single line of edge contacts on one side of the card, such test equipment may be easily adapted to electrically connect to the contacts of SIMM card placed flat in a carrier tray such as a JEDEC (Joint Electronic Device Engineering Council)-configured tray. In such a case, eight to ten of the SIMM cards may be tested, per tray, on a tester of the aforementioned configuration at one time.

The current generation of circuit card test trays for SIMMs are not, however, adaptable to handle the double-sided connectors of DIMMs because one-half of the edge connectors or contacts of the DIMM cards face opposite the test side of the tray by which contact is made. One possible solution is to design the DIMMs with through-hole or via-connected test pads extending from one side of the card to the other side, thus providing all edge connector contacts on one side of the card for test purposes. However, this potential solution requires greater use of limited circuit board real estate, as well as greater cost because of the additional traces and through-holes required. Moreover, the added conductive trace complexity may introduce more defects into the cards themselves, lowering yield for other than die-related failures.

Other circuit boards and cards employing double-sided connectors and presenting similar test and contact problems include (by way of example only) other multi-chip modules (MCMs) including other dice in addition to or in lieu of memory dice, as well as triple in-line memory modules (TRIMMs).

Electrical sockets for connecting SIMMs are taught by Lwee et al. (U.S. Pat. No. 5,256,078, Oct. 26, 1993, hereinafter the "'078" patent). Electrical sockets for connecting DIMMs are taught by Noschese et al. (U.S. Pat. No. 5,511, 985, Apr. 30, 1996, hereinafter the "'985" patent). While suitable for burn-in testing, neither the '078 patent nor the '985 patent teach a circuit card receptacle for routing edge connector traces from one side of the circuit card to the other side to facilitate testing of the card from a single side. Thus, there is a need in the art for a circuit card receptacle which allows single-sided testing of circuit cards or boards having double-sided edge connectors to avoid the necessity for investing in new and different test equipment to accommodate such dual-sided connector configurations.

SUMMARY OF THE INVENTION

The invention comprises, in several embodiments, a circuit card receptacle for routing dual-sided edge connectors from any kind of multi-chip module (CM) for effecting electrical contact from a single side of the receptacle. The invention may be combined with a test tray suitable for automatic testing of MCMs with automatic test equipment utilizing a bed of nails or other probe-type load board interface.

In the first embodiment of the invention, a U-shaped receptacle for circuit cards bearing dual-sided edge connectors or contacts is provided. The U-shaped receptacle allows direct connection of a "bed of nails" type load board to edge connectors on one side of a circuit card, termed for convenience the "test" side, and additionally provides test pads on the test side of the receptacle electrically connected to the non-test side edge connectors of the circuit card. The U-shaped receptacle is preferably pivotally mounted on a test tray for easy insertion and removal of the circuit cards and correct placement of the test pads to face the bottom of the tray.

A second embodiment of the invention also provides a circuit card receptacle pivotally mounted on a test tray. When viewed from a side elevation, the circuit card receptacle routes edge connector traces from both sides of the card to test pads on one surface of the receptacle located between the pivot point and the edge connector receptacle.

A third embodiment of the invention also provides a circuit card receptacle pivotally mounted on a test tray and, as illustrated, routes dual-sided edge connector traces to test pads on one surface of the receptacle. In this embodiment, a side elevation view reveals that the receptacle contains a pivot point located between test pads routed from edge connector traces and the edge connector receptacle.

It should be noted that the first embodiment may employ a pivot point located between the test points and the bottom or base of the "U," or a pivot point may be on the legs of the "U."

In the fourth embodiment, fixed circuit card receptacles are mounted on a test tray such that circuit cards inserted in the receptacles are perpendicular to the test tray. In this embodiment both sets of edge connector traces of the card are routed to test pads located on the underside of the tray. This embodiment provides greater card density for testing in comparison to the others if suitable test equipment is available. Hereinafter, this embodiment is referred to as the fixed perpendicular embodiment.

An alternative means, and a fifth embodiment, for mounting the card receptacles on the test tray is the use of a quick-release mechanism for securing and removing each card receptacle from the tray. This method of mounting provides the advantages of the pivot mounting arrangements, first, by facilitating insertion and removal of circuit cards from the receptacle and, second, by allowing the receptacle with card inserted to be held co-planar with the test tray. Thus a quick-release mechanism could be substituted for the pivot mounting mechanisms described in the first three embodiments above.

DETAILED DESCRIPTION OF THE INVENTION

An understanding of the detailed description of the invention is facilitated by drawing FIGS. 1 through 5. The five embodiments of the invention each solve the problem of interfacing a dual-sided circuit card to a single-sided load board used in functional testing without resorting to expensive retooling of the tester interface or purchase of different test equipment.

Figure 1:
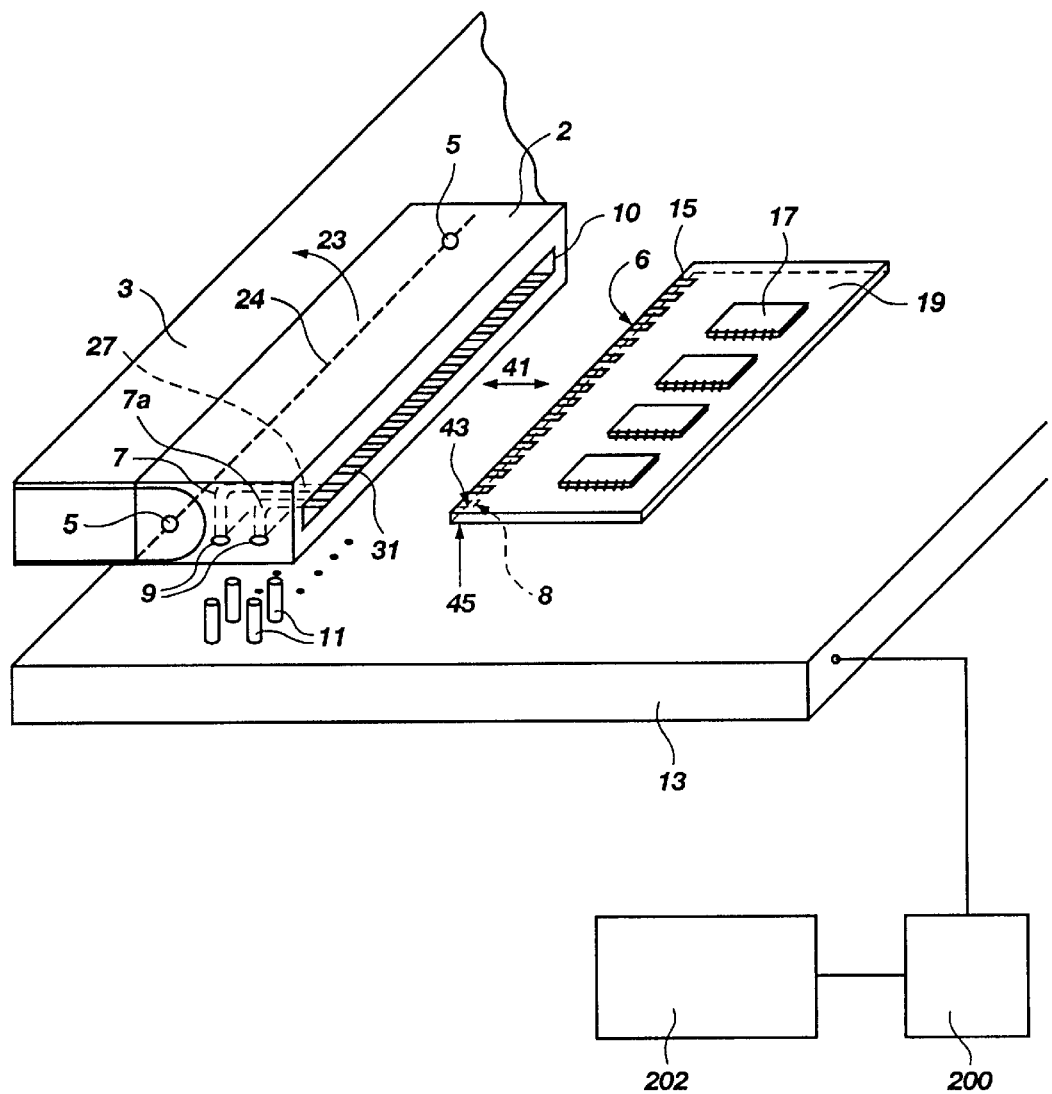
FIG. 1 is a perspective, generic view of the invention as used with a test tray and a multi-chip module to be tested.

FIG. 1 shows an exemplary, pictorial view of the invention comprising a circuit card receptacle 2 mounted on a test tray 3. The test tray could be fabricated with any number of receptacles 2, limited only by tray size and the number of test pins 11 (also termed "pogo pins", "nails" or "probes") available on the load board 13. Load board 13 is connected to a test interface adapter 200, which in turn is connected to a functional test system 202 comprising a computer controlled by a software test program. FIG. 1 shows a representative circuit card 19 which is to be inserted 41 into the receptacle 2. The circuit card 19 has a dual-sided edge connector 15 with two rows of edge connector traces 6 and 8, one on the non-test side 43, and another (not visible in FIG. 1) on the test side 45. Mounted on the circuit card 19 are integrated circuit dice 17. The circuit card 19 engages the receptacle 2 at a socket or slot 10, which may be formed with either closed or open lateral ends, but if with open ends also providing tabs or stops proximate each end for proper lateral card location. The edge connector traces 6 on non-test side 43 of the circuit card edge connector 15 connect with mating edge contacts 27 (one shown in broken lines in FIG. 1) within the slot 10 connected to circuit traces 7 extending from within the socket or slot 10 to a first row of test pads 9 located on the test side of the receptacle 2. Similarly, the edge connector traces 8 of test side 45 or the circuit card edge connector 15 connects with mating edge contacts 31 within the socket or slot 10 connected to circuit traces 7a extending from within the socket or slot 10 to an additional, second row of test pads 9 also located on the test side of receptacle 2. Mating edge contacts may comprise any suitable structures, such as leaf spring contacts or zero-insertion-force (ZIF) contacts. Further, circuit traces 7 and 7a are desirably routed and configured for minimal length and in matched impedance. The receptacle 2 is rotatable as shown at 23 about an axis 24 extending between pivot or hinge points 5 to facilitate insertion and removal 41 of the circuit card 19 under test. The test pins or probes 11 of the load board 13 mechanically contact and electrically communicate with the test pads 9 arrayed in a mating configuration when the test tray 3 is aligned and engaged with the load board 13. The five embodiments of the invention are described in further detail in FIGS. 2 through 6.

Figure 2A:
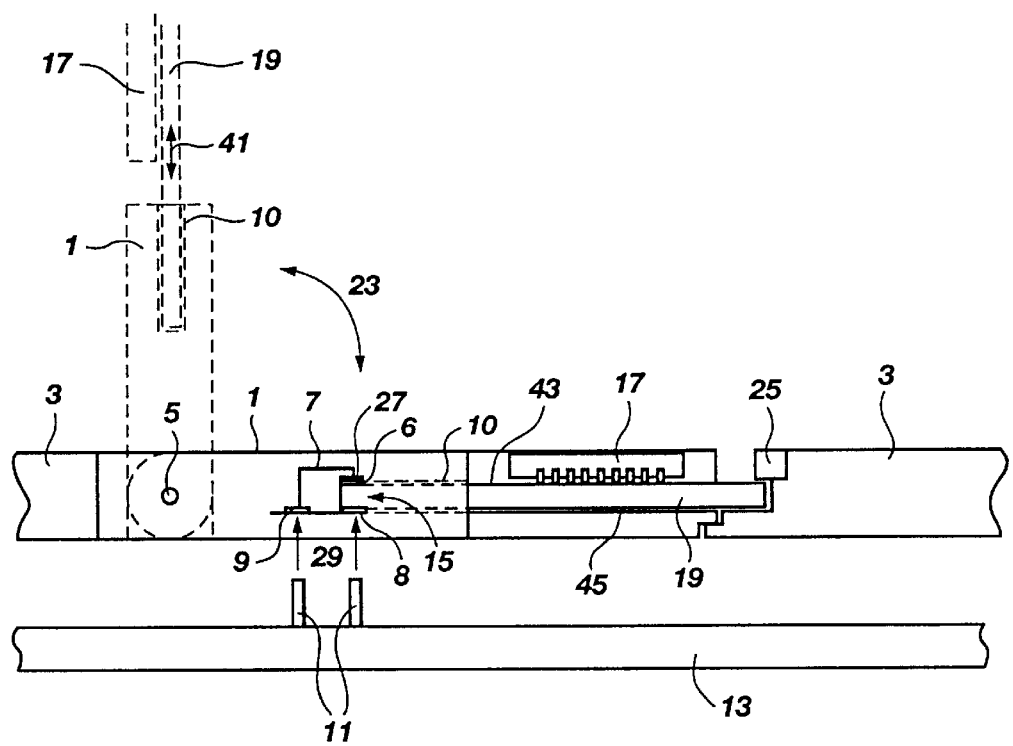
FIGS. 2A and 2B are side elevation and top views of a first embodiment of the invention employing a U-shaped, pivoting receptacle.
Figure 2B:
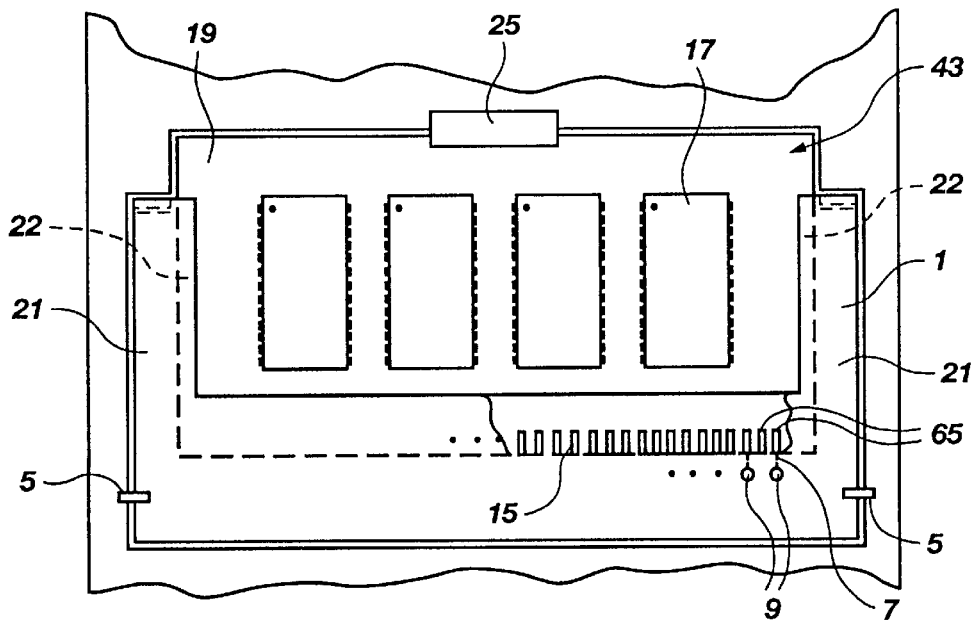

FIG. 2A shows a side cross-sectional elevation of the first embodiment of the invention. A U-shaped half-socket receptacle 1 is provided to route the non-test side edge connector traces 6 on non-test side 43 of circuit card 19 to test pads 9 by circuit traces 7, using mated edge contacts 27. This embodiment further allows direct connection 29 to test side edge connector traces 8 on the circuit card 19. It should be noted that, in this embodiment, test pads 9 and test side edge connector traces 8 lie in substantially co-planar relationship parallel to the plane of test tray 3 for coequal contact with load board 13. Since only one side of card 19 is connected by traces 7 to test pads 9, while connector traces 8 make direct contact with pins 11, it may be desirable to include components in traces 7 so that impedance matching may be achieved. The half-socket receptacle 1 is pivotally mounted 5 on a test tray 3 to allow: (1) linear insertion and removal 41 of a circuit card 19 to be tested, and (2) rotation 23 of the circuit card 19 until it is co-planar with the tray 3 and ready to interface with the "pogo" pins or nails 11 on the load board 13. FIG. 2B shows the circuit card 19 held in the half-socket receptacle 1 by slots 22 in legs 21 of the "U" engaging the lateral marginal extremities of the circuit card 19. The circuit card 19, inserted in the half-socket receptacle 11, is held co-planar within the test tray 3 by a retaining clip 25 extending or protruding from test tray 3 to engage the top of the circuit card opposite the edge connector 15. The retaining clip 25 could be of any conventional design such as a leaf or bow spring, a spring-loaded ball detent, or a pivoting post, and so will not be further described. This embodiment may be modified to provide test pads electrically connected to edge connector traces 6, 8 on both sides of a card 19, by configuring receptacle 1 as shown in FIGS. 3 and 4 and subsequently described herein.

Figure 3:
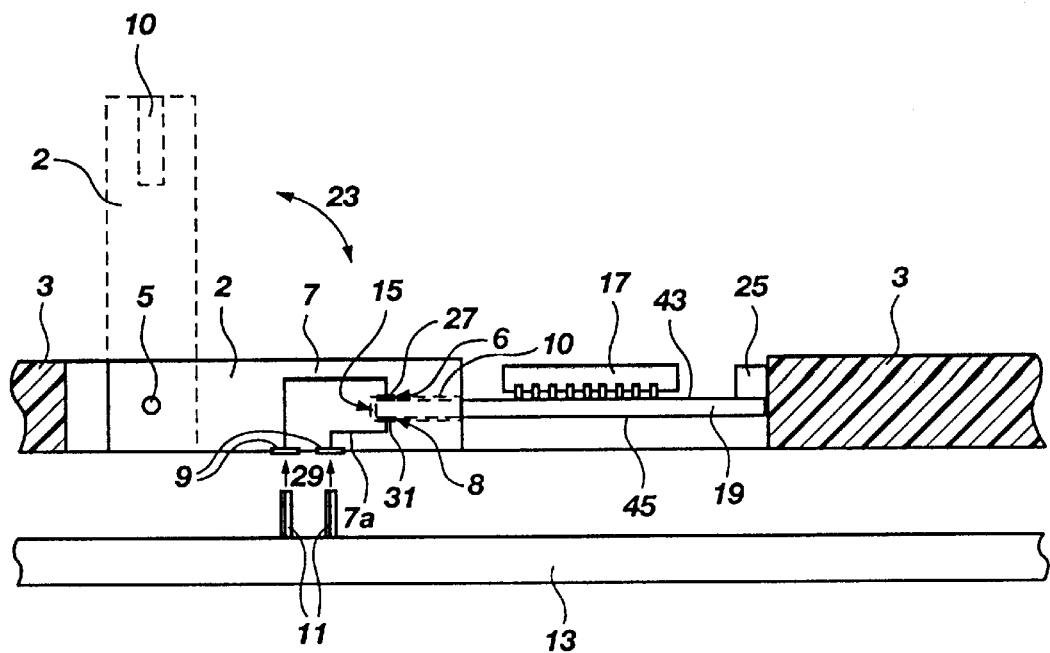
FIG. 3 is a side elevation of a second embodiment of the invention where the test pads are located between the pivot point of a pivotable circuit card receptacle and the edge connector receptacle.

FIG. 3 is a side elevation of the second embodiment of the invention. A receptacle 2 including a slot or socket 10 is provided to route connector traces or contacts 6, 8 from both sides of the dual-sided edge connector 15 to test pads 9 on the test side 43 of a circuit card 19. The receptacle 2 is pivotally mounted at 5 to the test tray 3 and locates test pads 9 between the pivot point 5 and the circuit card socket or slot 10. Like the first embodiment, the receptacle 2 is pivotally mounted on a test tray 3 to facilitate insertion and removal 41 of the circuit card 19, and rotation 23 of the circuit card 19 until it is co-planar with the tray 3 and ready to interface with the pogo pins 11 of the load board 13. The circuit card 19 is held in the receptacle 2 by socket or slot 10. The edge contacts 27 and 31 of socket 10 mechanically and electrically engage the connector traces 6, 8 of dual-sided edge connector 15 of the circuit card 19 and are respectively routed to test pads 9 by circuit traces 7 and 7a of receptacle 2. The circuit card is held co-planar within the test tray 3 by a retaining clip 25 of any suitable configuration, as previously discussed, at the edge of the circuit card opposite that occupied by the edge connector 15.

Figure 4:
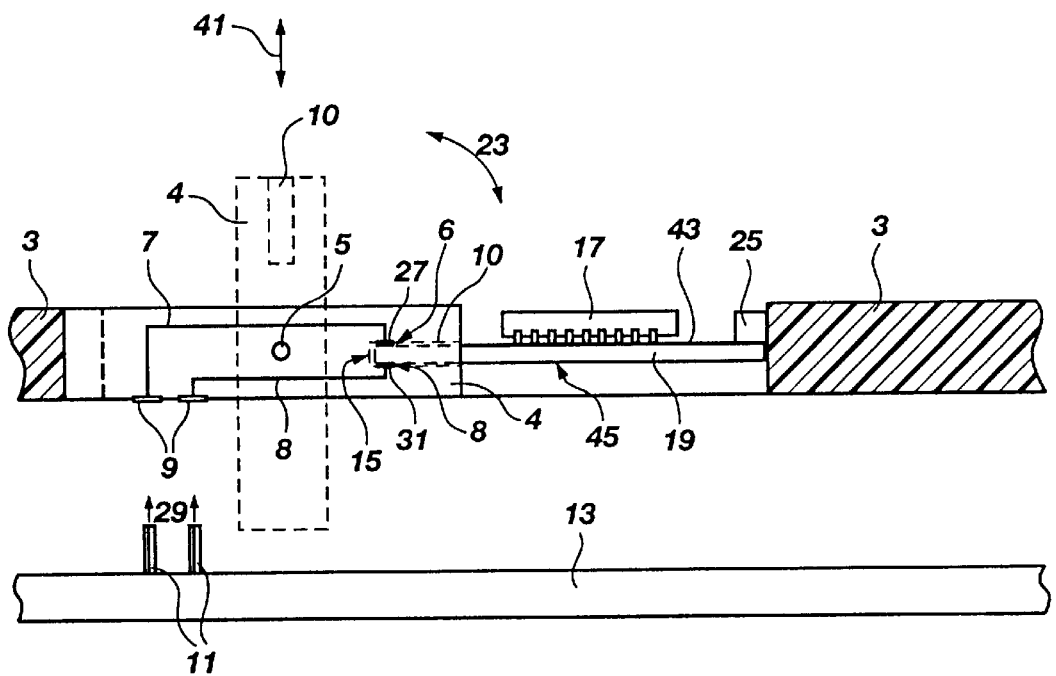
FIG. 4 is a side elevation of a third embodiment of the invention where the pivot point of a pivoting circuit card receptacle is located between the test pads and the edge connector receptacle.

FIG. 4 shows a side elevation of the third embodiment of the invention. A receptacle 4 is provided to route connector traces or contacts 6, 8 from opposing sides of the dual-sided edge connector 15 to test pads 9 on the test side 43 of a circuit card 19. The socket 4 is pivotally mounted at 5 to the test tray 3. The pivot point 5 is located between the test pads 9 and the circuit card slot 10 of receptacle 4. Like prior disclosed embodiments, the receptacle 4 is pivotally mounted on a test tray 3 to allow insertion and removal 41 of the circuit card 19 under test, and rotation 23 of the circuit card until it is co-planar with the tray 3 and ready to interface with the pogo pins 11 on the load board 13. The circuit card 19 is held in the receptacle by a socket or slot 10, which mechanically and electrically engages the dual-sided edge connector 15 of the circuit card 19. The circuit card is held co-planar within the test tray by a retaining clip 25 of suitable design at the end opposite the edge connector. The advantage of this embodiment over the second embodiment is that the contact 29 of the pogo pins 11 against the test pads 9 tends to hold the circuit card co-planar within the test tray 3, permitting use of a much less robust retaining clip 25, or eliminating the need for same altogether. The first embodiment may be modified in a similar manner by movement of pivot or large points accordingly.

Figure 5:
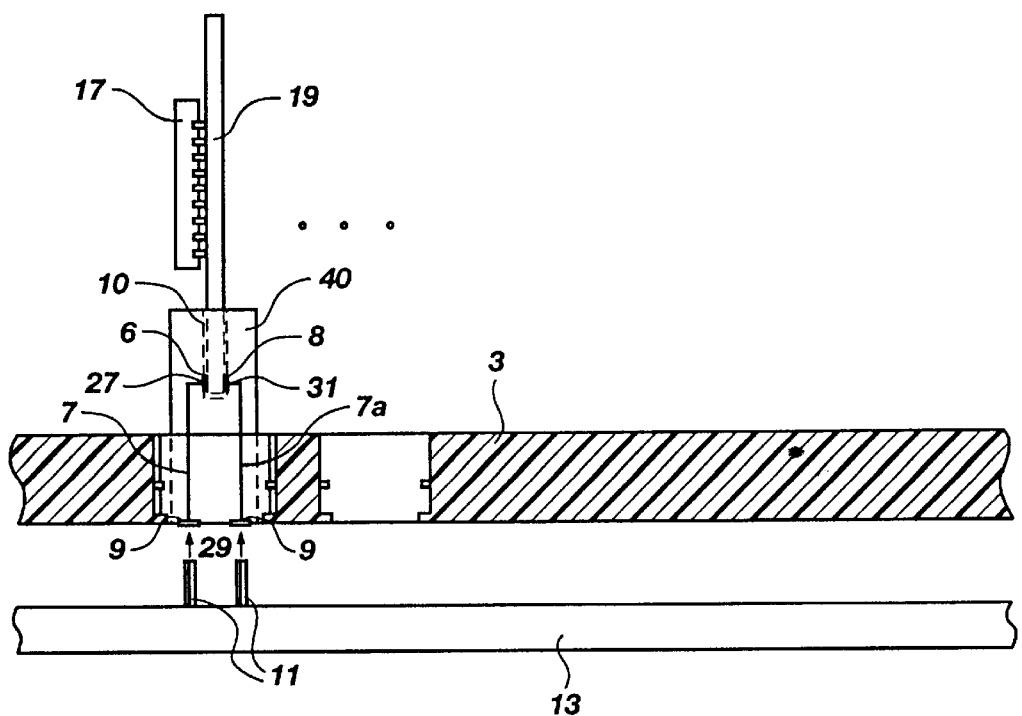
FIG. 5 is a side elevation of a fourth embodiment of the invention, also referred to as the fixed perpendicular embodiment, where the circuit card receptacles are rigidly fixed to the test tray which holds circuit cards under test perpendicular to the test tray.

A fourth embodiment of the invention, shown in FIG. 5, provides a plug-in receptacle 40 removably mounted on a test tray 3 such that each circuit card 19 under test is mounted perpendicular to the test tray 3. In this embodiment, the circuit card 19 is received in a socket or slot 10 and the receptacle 40 routes connector traces 6 and 8 by circuit traces 7 and 7a to test pads 9 on the bottom of the receptacle 40. While receptacle 40 is preferably formed separately from tray 3 and is plugged thereinto in a snap-in fashion as depicted in FIG. 5, a tray with a plurality of integrally-molded receptacles 40 may be fabricated. The advantage of this embodiment is that potentially more circuit cards could be mounted on a tray. However, this embodiment does not facilitate stacking of trays with mounted circuit cards 19 ready to test because the circuit cards 19 project from the plane of the tray. In comparison, test trays incorporating the first three embodiments can be stacked easily to facilitate movement and storage of the loaded test trays in an automated production test environment. Further, the circuit density in the fixed perpendicular embodiment may require upgraded test equipment.

Figure 6:
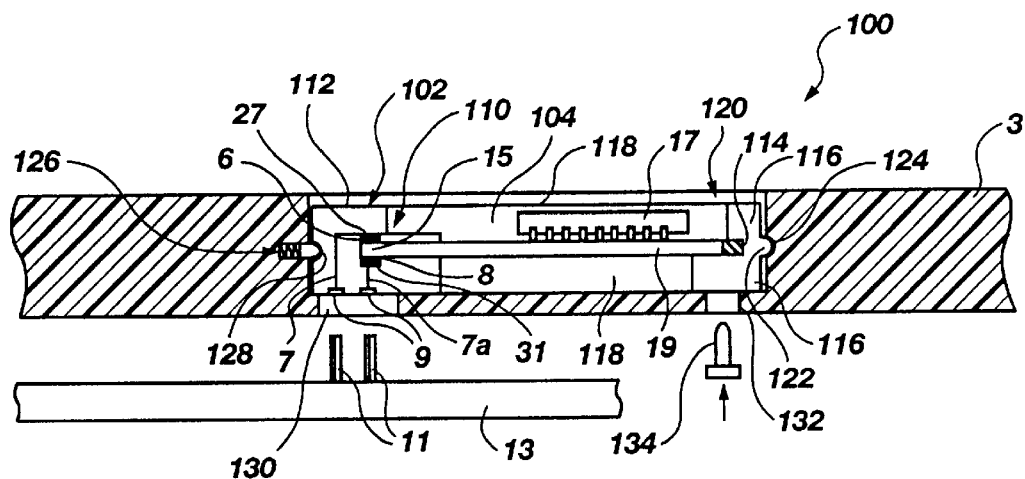
FIG. 6 is a side elevation of a fifth embodiment of the invention, wherein a quick-release mechanism employing a snap-in type receptacle is used in lieu of a pivoting receptacle.

The various pivot mounting mechanisms described above may be replaced by a quick-release mechanism, such as depicted in FIG. 6. Such a quick-release mechanism allows rapid fixing and removal of the receptacle to, in turn, facilitate insertion and removal of the circuit card to be tested. The quick-release mechanism also allows the card and receptacle combination to lie co-planar with the test tray, as with the pivoting embodiments. Once the cards and receptacles are secured, the entire tray can be interfaced with a bed of nails type load board on a functional tester. Thus, a quick-release mechanism substitutes for the pivot mount. The pivot mounting scheme is preferable only because it is integrated, whereas the quick-release scheme permits preloading of circuit cards in receptacles for subsequent insertion in trays. Trays using both pivoting and quick-release receptacles may be easily stacked.

The quick-release mechanism 100 as shown in FIG. 6 comprises a rectangular, window-frame type receptacle 102 into which a circuit card 19 may be inserted. Receptacle 102 includes an upper window 104 in its upper surface (as depicted in FIG. 6) through which circuit card 19 may be inserted with its double-sided edge connector 15 extending into shallow slot 110 in receptacle base 112 wherein edge contacts 27 and 31 respectively mechanically and electrically engage connector traces 6, 8 of double-sided edge connector 15. Contacts 27 electrically communicate through circuit traces 7 with a first set of test pads 9 on the bottom of receptacle 102, while contacts 31 communicate through circuit traces 7a with a second set of test pads 9 coplanar with the first set. Circuit card 19 is maintained in slot 110 by an elastomeric biasing pad 114 carried by receptacle header 116. Base 112 and header 116 are joined by side columns 118 (one shown) extending transversely therebetween. Biasing pad 114 needs to provide only a nominal bias to retain circuit card 19 in receptacle 102 during handling and testing, as receptacle 102, and not circuit card 19, sustains the transverse mechanical loading imposed by contact of pins 11 with tray 3. Receptacle 102, in turn, is secured within receptacle bay 120 of tray 3 by engagement of linear protrusion 122 (which extends across the top of header 116) with slot 124 on one end of bay 120, while a detent 126 (shown here by way of example as a coil-spring-biased, bullet-shaped element with a hemispherical head) engages dimple or cavity 128 in receptacle base 112. Test pads 9 are exposed to pins 11 through test aperture 130 in the bottom of receptacle bay 120 in tray 3.

In operation, circuit card 19 is loaded into a receptacle 102 as previously discussed. Receptacle 102 is then snapped into a bay 120 in a test tray 3 (each test tray preferably having a number of such bays formed therein), each bay 120 receiving a receptacle 102 carrying a circuit card 19. A tray of cards 19 is then tested on load board 13, pogo pins 11 contacting test pads 9 associated with each circuit card 19. After load testing, receptacles 102 are unloaded by pulling them out of bays 120 transverse to the plane of tray 3, overcoming the spring bias of detent 126. The insertion and removal operation may be manual, and finger-holds (not shown) provided on receptacle 102. Further, an access window 132 may be provided in the bottom of each bay 120 so that a pin-type removal mechanism 134 may engage the headers 116 of receptacles 102 and "pop" them out of tray 3, as shown. Receptacles 102 may also be employed for storage, handling and testing of circuit cards 19 before and after load testing for protection of cards 19.

It will be understood that all of the embodiments herein should be formed of a low-static plastic or other polymers, or include an anti-static coating thereon. It will be further understood that each receptacle embodiment may be tailored for a specific card configuration (size and shape, number of contacts, contact pitch, etc.), and that such receptacles will preferably be configured on their exteriors to be interchangeable on carrier trays, in terms of interchangeability of receptacles for others of the same embodiment.

Although the present invention has been described with reference to particular embodiments, the invention is not limited to these described embodiments and additions, deletions and modifications to the disclosed embodiments, including without limitation the combination of features of different embodiments, will be apparent to those of ordinary skill in the art and lie within the scope of the claims following this specification.

What is claimed is:

1. A circuit card receptacle for adapting a semiconductor die-carrying circuit card bearing an edge connector having a first set of contacts on a first side of said circuit card and a second set of contacts on a second, opposing side of said circuit card for single-sided electrical contact, comprising:

an elongated slot structure including a base wall and a side wall facing said base wall for receiving said edge connector of said circuit card;

a set of edge contacts extending over said side wall within said elongated slot structure for mating with said first set of contacts of said edge connector on said first side of said circuit card;

a set of electrical test pads located adjacent a surface of said base wall spaced from said side wall in a direction transverse thereto by a distance substantially equal to a thickness of said circuit card, said set of electrical test pads being offset from said side wall in a direction substantially parallel thereto and facing in the same direction as said side wall so that said set of electrical test pads is substantially coplanar with said second set of contacts of said circuit card when said edge connector of said circuit card is received within said elongated slot structure; and circuit traces carried by said receptacle connecting contacts of said set of edge contacts to electrical test pads of said set of electrical test pads.

2. The receptacle of claim 1, further comprising a U-shaped guide having spaced legs for engaging lateral extremities of the circuit card with said edge connector disposed in said slot.

3. The receptacle of claim 1, wherein said contacts are selected from a group comprising spring leaf contacts and zero-insertion force (ZIF) contacts.

4. The receptacle of claim 1, wherein said circuit traces are routed for minimal length and impedance matching.

5. The receptacle of claim 1, further comprising a load board including pin-type probes configured to contact said test pads and said second side of said double-sided edge connector.

6. The receptacle of claim 1, wherein said circuit card is selected from the group consisting of dual in-line memory modules (DIMMS), multi-chip modules (MCMs) and triple in-line memory modules (TRIMMs).

7. The receptacle of claim 1, further including a substantially planar receptacle carrier and a mechanism for mounting said receptacle to said carrier, permitting insertion and removal of said circuit card from said carrier, while also allowing said circuit card to lie co-planar with said receptacle carrier when said receptacle is mounted thereto.

8. The receptacle of claim 7, wherein said mounting mechanism comprises a pivotal mounting mechanism.

9. The receptacle of claim 7, wherein said mounting mechanism comprises a structure permitting insertion and removal of said receptacle having a circuit card inserted therein.

10. The receptacle of claim 7, wherein said carrier comprises an injection-molded tray configured to hold a plurality of circuit cards inserted in receptacles.

11. The receptacle of claim 10, wherein said tray comprises a stackable tray suitable for vertical stacking with at least one other such tray bearing at least one circuit card held in a receptacle.

* * * * *

UNITED STATES PATENT AND TRADEMARK OFFICE
CERTIFICATE OF CORRECTION

PATENT NO. : 6,004,142
DATED : December 21, 1999
INVENTOR(S) : James M. Wark

It is certified that error appears in the above-identified patent and that said Letters Patent is hereby corrected as shown below:

Title page, Item [54] and Column 1, line 1,
Change "INTERPOSER CONVERTER" to -- INTERPOSER/CONVERTER --

Title page,
Item [56], References Cited, U.S. PATENT DOCUMENTS, before "10/1972" insert -- * --; before "7/1973" insert -- * --; before "1/1988" insert -- * --; before "8/1994" insert -- * --; before "8/1994" insert -- * --; before "5/1996" insert -- * --; before "8/1997" insert -- * --; before "11/1997" insert -- * --; before "12/1997" insert -- * --; before "7/1998" insert -- * --; and insert -- * cited by examiner --
FOREIGN PATENT DOCUMENTS, before "7/1985" insert -- * --

Column 1,
Line 37, change "cards," to -- card --
Line 39, at the end of the line, after "SIMM" change "card" to -- cards --

Column 2,
Line 18, change "(CM)" to -- (MCM) --

Column 3,
Line 60, after "6" and before "non-test" insert -- of --

Column 7,
Line 25, after "slot" and before the period insert -- structure --
Line 26, after "said" and before "contacts" insert -- edge --

Column 8,
Line 3, delete "double-sided"

Signed and Sealed this

Fourth Day of January, 2005

JON W. DUDAS
*Director of the United States Patent and Trademark Office*